United States Patent [19]

Conner

[11] 4,450,560
[45] May 22, 1984

[54] TESTER FOR LSI DEVICES AND MEMORY DEVICES

[75] Inventor: George W. Conner, Newbury Park, Calif.

[73] Assignee: Teradyne, Inc., Boston, Mass.

[21] Appl. No.: 309,981

[22] Filed: Oct. 9, 1981

[51] Int. Cl.³ .......................................... G01R 31/28
[52] U.S. Cl. .................................. 371/25; 324/73 R; 371/21; 371/27
[58] Field of Search ...................... 371/25, 27, 20, 21; 324/73 R, 73 AT

[56] References Cited

U.S. PATENT DOCUMENTS

| | | | |
|---|---|---|---|
| 2,905,930 | 9/1959 | Golden | 340/174 |
| 3,235,849 | 2/1966 | Klein | 340/172.5 |
| 3,311,890 | 3/1967 | Waaben | 340/172.5 |
| 3,474,421 | 10/1969 | Stein | 340/174 |
| 3,659,088 | 4/1972 | Boisvert, Jr. | 371/21 |
| 3,739,349 | 6/1973 | Burdette | 340/172.5 |
| 3,781,829 | 12/1973 | Singh | 340/173 |
| 3,805,243 | 4/1974 | Boisvert | 340/172.5 |
| 3,832,535 | 8/1974 | De Vito | 371/25 |
| 3,873,817 | 3/1975 | Barnard | 371/25 |
| 3,916,306 | 10/1975 | Patti | 324/73 R |
| 4,099,259 | 7/1978 | Parsons et al. | 364/900 |
| 4,137,562 | 1/1979 | Boeck et al. | 364/200 |
| 4,195,343 | 3/1980 | Joyce | 364/200 |
| 4,195,779 | 7/1980 | Benton et al. | 371/21 |
| 4,216,539 | 8/1980 | Raymond | 371/20 |
| 4,249,173 | 2/1981 | Lockhart | 340/731 |
| 4,287,594 | 9/1981 | Shirasaka | 371/25 |
| 4,380,068 | 4/1983 | de Couasnon | 371/25 |

Primary Examiner—Charles E. Atkinson

[57] ABSTRACT

A single tester tests both LSI and memory devices by storing test signals and standards for the pins of LSI devices in a storage element, providing test signals and standards for the data pins of memory devices from a generator, and selectably routing the test signals and standards from the storage element for LSI testing and from the generator for memory testing; format and timing information for each test signal and standard (for LSI testing) or for groups of test signals and standards (for memory testing) is stored in a second storage element and addresses corresponding to each test signal and standard (for LSI testing) or to each group of test signals and standards (for memory testing) and selectably provided to the second storage element.

11 Claims, 2 Drawing Figures

TESTER FOR LSI DEVICES AND MEMORY DEVICES

BACKGROUND OF THE INVENTION

This invention relates to testing large-scale integration (LSI) devices and memory devices by injecting test signals and comparing the resulting output signals with standards.

In LSI device testing, appropriate test signals, standards, and related format and timing information, for each pin of the device, are preloaded into random access memory dedicated to that pin. During testing, an address generator feeds address signals to the memory to produce the desired sequence of injections and comparisons.

In memory device testing, by contrast, the address generator simultaneously feeds address signals to the device's "address" pins (which thus receive the address signals as test signals) and activates a separate generator which feeds "data" test signals to the device's data pins. Output signals appear only on the data pins and are compared with the data signals previously injected. Although there is random access memory dedicated to each pin, it stores only format and timing information (which typically remains constant for long sequences of test signals) and, in some embodiments, address descrambling information.

SUMMARY OF THE INVENTION

In general, the invention features in one aspect apparatus for testing LSI and memory devices by injecting test signals and comparing resulting output signals with standards, the devices each having a multiplicity of pins the pins of the memory devices comprising address pins and data pins, the apparatus comprising a sequence controller for sequencing the injections and the comparisons, a storage element for storing the test signals and the standards for the LSI devices, a generator for generating the test signals and the standards for the memory devices, and source switching circuitry responsive to the sequence controller and connected to selectably route the test signals and the standards for the LSI devices from the storage element to the pins, or the test signals and the standards for the memory devices from the generator to the data pins.

In general, the invention features in another aspect apparatus comprising a sequence controller for sequencing the injections and the comparisons, a format and timing generator for generating format and timing information corresponding to the test signals and the standards, a sequence generator for causing the format and timing generator to provide updated format and timing information corresponding to each of the test signals and the standards for testing the LSI devices, a group sequence generator for causing the format and timing generator to provide updated format and timing information corresponding to groups of the test signals and the standards for testing the memory devices, and a mode controller responsive to the sequence controller for selectably activating either the sequence generator or the group sequence generator for testing respectively the LSI devices or the memory devices.

In preferred embodiments, the format and timing generator comprises a format memory for storing format information, and a format address memory responsive to the sequence controller for storing addresses corresponding to the locations in the format memory; a timing memory for storing timing information, a timing generator for providing timing pulses in accordance with the timing information, and a timing address memory responsive to the sequence controller for storing addresses corresponding to the locations in the timing memory; the apparatus further comprises a comparator for providing error signals when the output signals differ from the standards, a fail processor responsive to the comparator, a fail sequence memory responsive to the sequence controller and to the fail processor for storing sequences of the error signals and the test signals corresponding to the pins of the LSI devices, and a fail map memory responsive to the fail processor and to the sequence controller for storing the error signals as a map corresponding to the memory locations in the memory devices.

In another aspect, the invention features a method of testing LSI devices having memory portions and non-memory portions, comprising storing the test signals and standards for the non-memory portions in a first storage element; storing format and timing information corresponding to each of the test signals and the standards for the non-memory portions in a second storage element; storing format and timing information corresponding to groups of the test signals and the standards for the memory portions in the second storage element; triggering a selector to route the test signals and the standards from the first storage element to the pins of the non-memory portions; generating an address corresponding to each of the test signals and the standards for the non-memory portions, and simultaneously triggering a selector to route each address to the second storage element; causing a generator to generate the test signals and the standards for the memory portions, and simultaneously triggering the selector to route the test signals and the standards to the data pins of the memory portions; and generating an address corresponding to each of the groups of the test signals and the standards for the memory portions, and simultaneously triggering a selector to route each address to the second storage element.

The invention permits flexible, economical and efficient testing of LSI devices and memory devices (and LSI devices having memory portions) one after another in any order, and flexibly permits any pin of each tested device to be treated either as an LSI pin, a memory data pin or a memory address pin for any test signal cycle.

DESCRIPTION OF THE PREFERRED EMBODIMENT

We turn now to the structure and operation of the preferred embodiment, first briefly describing the drawings thereof.

DRAWINGS

STRUCTURE

Figure 1:
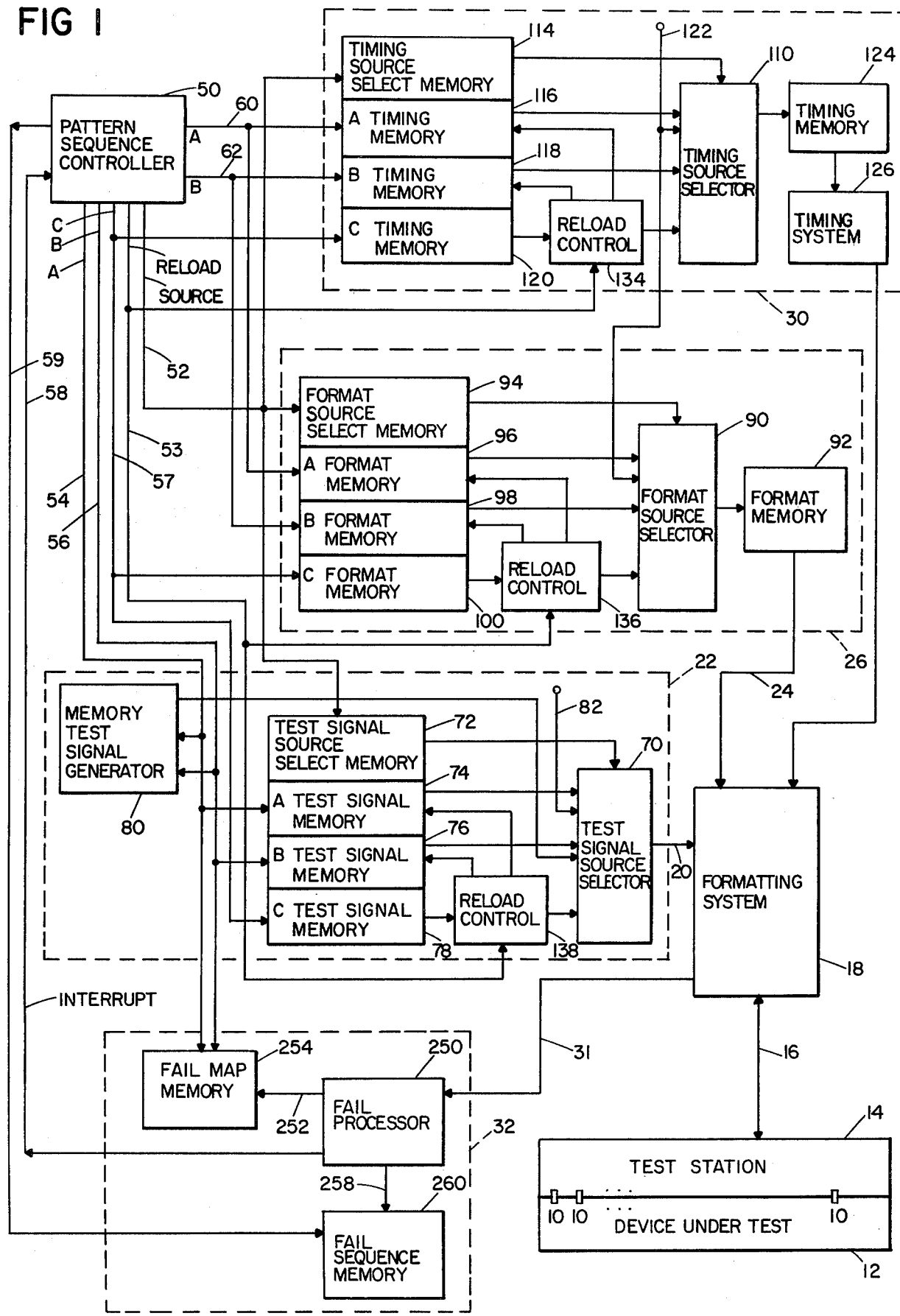
FIG. 1 is a block diagram of the components of a tester according to the invention.

Referring to FIG. 1, each pin 10 of device 12 is connected through test station 14 (containing pin output follower and conventional pin driver circuitry) and two-way line 16 to formatting system 18 (containing integrated circuit logic elements including multiplexers for formatting and timing test signal injections and comparisons). Inputs of formatting system 18 are respectively connected through test signal line 20 to test signal generation circuitry 22; through format line 24 to format generation circuitry 26; and through timing line 28 to timing generation circuitry 30. An output of formatting system 18 is connected by error line 31 to fail processing circuitry 32.

Test signal generation circuitry 22 is connected to pattern sequence controller 50 by source select line 52, reload line 53, and test signal memory control lines 54, 56 and 57 (lines 54 and 56, with fail system interrupt and control lines 58 and 59, also connecting pattern sequence controller 50 to fail processing circuitry 32). Source select line 52, reload line 53, control line 57, and format and timing memory control lines 60 and 62 connect pattern sequence controller 50 to format and timing generation circuitries 26 and 30.

In test signal generation circuitry 22, test signal source selector 70 is connected to test signal source select memory 72 (of a capacity of 256 bytes per pin), and to five possible sources of test signals: A or B test signal memories 74, 76 (which store LSI device test signals for each pin 10 or memory device address descramble information for memory device address pins); C test signal memory 78 (through reload control 138); memory test signal generator 80 (containing an address-driven algorithmic generator comprising logic elements and an address-driven look-up table generator comprising memory elements); and alternate source line 82.

Similarly, in format address generation circuitry 26, format data source selector 90 is connected to format source select memory 94 (of a capacity of 256 bytes per pin), and to four possible sources of format addresses: A or B format memories 96, 98; C format memory 100 (through reload control 136); and alternate source line 122. An output of format surce selector 90 is connected to format memory 92 (of a capacity of 256 bytes per pin).

In timing generation circuitry 30, timing source selector 110 is connected to timing source select memory 114 (of a capacity 256 bytes per pin) and to four possible sources of timing information addresses: A or B timing memories 116, 118; C timing memory 120 (through reload control 134); and alternate source line 122. The output of timing source selector 110 is connected through timing memory 124 (a RAM having a capacity of 256 bytes per pin) to timing system 126, which contains programmable timing generators.

The A memories 74, 96 and 116, and B memories 76, 98 and 118 are respectively parts of two identical 4 K static RAMs, and C memories 78, 100 and 120 are parts of a 64 K to 256 K dynamic RAM. Selectors 70, 90, 110 are conventional multiplexers. Reload controls 134, 136, 138 (containing conventional multiplexers) have inputs connected to reload line 53 and respectively to C memories 78, 100 and 120, and have outputs connected respectively to A memories 74, 96 and 116, and B memories 76, 98 and 188.

In fail processing circuitry 32, fail processor 250 (containing integrated circuit logic elements for analyzing and routing error signals) is connected by memory device error line 252 to fail map memory 254 (a real-time memory device for storing error signals which can be configured as 16×64 K, 8×118 K or 1 K×1 K to hold memory device error signals). Fail processor 250 is also connected by fail sequence line 258 to fail sequence memory 260, a RAM which stores failure signals and related block and cycle information.

Figure 2:
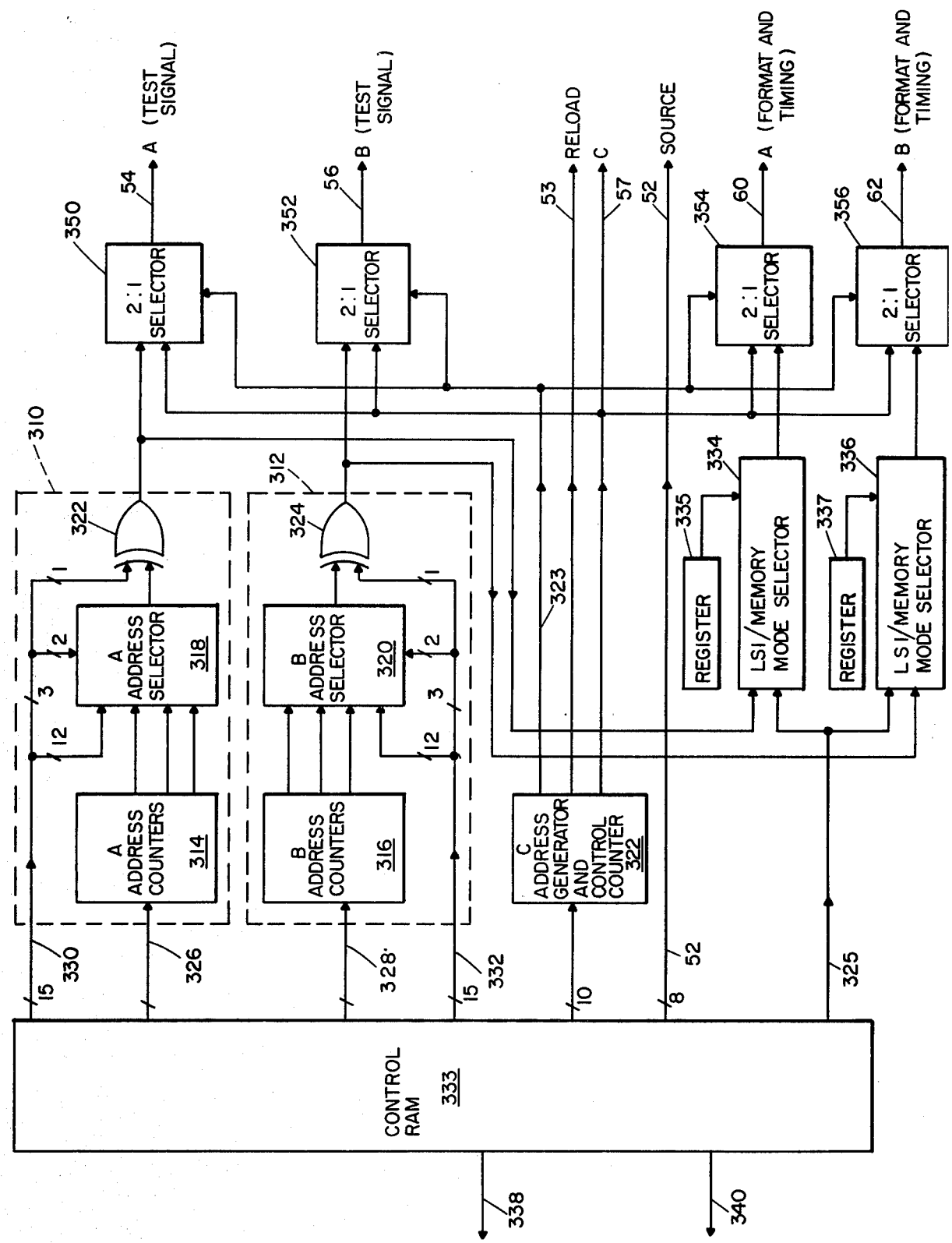
FIG. 2 is a block diagram of the control RAM and other components of the pattern sequence controller shown in FIG. 1.

Referring to FIG. 2, A and B test signal address generators 310, 312 (respectively each containing three 12-bit address counters 314, 316, address selectors 318, 320, and EXCLUSIVE OR address inhibit gates 322, 324) are respectively connected by control bit lines 326, 328 and generator inhibit lines 330, 332 to control RAM 333 (a programmable microprocessor having a capacity of 4 K instruction words of 112 bits each). RAM 333 is also connected: through C address generator and control counter 322 (containing integrated circuit logic and timing circuitry for addressing and controlling C memories 78, 100, 120) to control line 57 and reload line 53; to source select line 52; through memory device format and timing address line 325 to LSI/memory mode selectors 334, 336 (which are also connected to A and B test signal address generators 310, 312); through sequence control line 338 to circuitry not shown for determining the address of the next control instruction in RAM 333 to be executed; and through test control line 340 to test control circuitry not shown.

Selectors 350 and 352 have data inputs connected to C address line 57 and respectively to A and B test signal address generators 310 and 312, and have control inputs connected by line 323 to C address generator and control counter 322.

Selectors 354 and 356 similarly have inputs connected to C address line 57 and respectively to LSI/memory mode selectors 334 and 336, and control inputs connected to C address generator and control counter 322. Control inputs of LSI/memory mode selectors 334 and 336 are respectively connected to registers 335 and 337.

Selectors 318, 320, 334, 336, 350, 352, 354 and 356 are conventional integrated circuit multiplexers.

OPERATION

The tester can be switched back and forth between testing LSI devices and memory devices in any sequence, and can test LSI devices having memory portions and non-memory portions. The testing mode is changed between the LSI mode and the memory mode by changing the values in registers 335 and 337 to control selectors 334 and 336 respectively to determine the source of addresses for A and B timing and format memories 96, 98, 116 and 118; and by changing the control bits which pass over line 52 to source select memories 72, 94 and 114, to determine the source of the test signals.

LSI DEVICE TESTING

In LSI device testing, sequences of test signals for all pins 10 are supplied by formatting system 18 to test station 14 alternately from A or B test signal memory 74 or 76, the choice being determined by test signal source selector 70 as dictated by test signal source select memory 72 under the control of pattern sequence controller 50.

When A test signal memory 74 is selected by test signal source selector 70, it delivers test signals from a sequence of its memory locations governed by addresses provided on A address line 54. Simultaneously, B test signal memory 76 is being reloaded from a larger pool of test signals stored in test signal memory 78. After A test signal memory 74 has exhausted its supply of test data, test signal source selector 70 without delay causes B test signal memory 76 to deliver its newly replenished supply and A test signal memory 74 is reloaded from C test signal memory 78.

The reloading is controlled by C address generator and control counter 322, which issues a "load A" or "load B" signal on line 53 to reload control 124, and C addresses on line 57, in a manner and using apparatus described in U.S. Patent Application Ser. No. 309,982, titled "Test Signal Reloader", Garry C. Gillette, filed concurrently and incorporated herein by reference.

Each LSI test signal is delivered at a time specified by timing system 126 in accordance with timing information stored in timing memory 114, and in a format (e.g., non-return to zero (NRZ), return to zero (RZ), return to one (RTO), or return to complement (RTC)), specified by format information stored in format memory 92. Timing memory 114 and format memory 92 are respectively addressed alternately from A timing and format memories 116, 96, and B timing and format memories 118, 98 (in the same order as the alternation between A and B test signal memories 74, 76) under the control respectively of timing and format source select memories 114, 94 through timing data and format data source selectors 110, 90. The alternation is triggered on lines 60 and 62 (by the same A and B addresses as are provided on lines 54 and 56) by operation of LSI/memory mode selectors 334, 336 which are controlled by registers 335, 337 to operate in the "LSI" test mode. When either the A or B timing and format memories are not providing signals, they are being reloaded from a larger timing and format signal pool stored in C timing and format memories 100, 120.

Output signals from pins 10 received by formatting system 18 are compared (by conventional integrated circuit comparator circuitry in formatting system 18) with standards (provided on line 20 in the same manner as the test signals), and corresponding error signals are sent through fail processor 250 to fail sequence memory 260, under the control of pattern sequence controller 50. Upon the occurrence of predetermined fail sequences, fail processor 250 sends an interrupt signal to pattern sequence controller 50, which can then alter the test sequence.

Memory Device Testing

In memory device testing, test signals are provided to the device data pin from memory test signal generator 80 (based on signals provided on lines 56 and 58) through test source selector 70; and "address" test signals for the X and Y address pins of the device are provided directly from A and B test signal memory address generators 310, 312 through A and B test signal memories 74, 76 (where they may be descrambled to conform to the memory layout of device 12).

Format and timing information (which typically remains unchanged for groups of memory device test signals) is determined by format address and timing generation circuitries 26 and 30 based on addresses provided directly from control RAM 333 over line 325 through LSI/memory mode selectors 334, 336, which are set to the "memory" test mode by registers 335, 337.

Error signals are sent through fail processor 250 to fail map memory 254, which stores the errors (under the control of address signals on lines 54, 56) in locations homologous to the failing locations in device 12 to provide a map of its "bad" memory locations.

Subject matter disclosed in this application concerning the reloading of the A and B memories from a pool of test signals and format and timing information stored in the C memories was the invention of Garry C. Gillette and is disclosed and claimed in his U.S. patent application Ser. No. 309,982, titled "Test Signal Reloader," assigned to the assignee of this application.

Other embodiments are within the following claims.

What is claimed is:

1. Apparatus for testing LSI and memory devices by injecting test signals and comparing resulting output signals with standards, said devices each having a multiplicity of pins, said pins of said memory devices comprising address pins and data pins, said apparatus comprising:

a sequence controller for sequencing the injections of said test signals and the comparisons of said resulting output signals with said standards, a storage element for storing said test signals and said standards for said LSI devices, a generator for generating said test signals and said standards for said memory devices, source switching circuitry responsive to said sequence controller, said source switching circuitry being connected to selectably route said test signals and said standards for said LSI devices from said storage element to said pins, or said test signals and said standards for said memory devices from said generator to said data pins, and a comparator for comparing said resulting output signals with said standards.

2. Apparatus for testing LSI and memory devices by injecting test signals and comparing resulting output signals with standards, said devices each having a multiplicity of pins, said pins of said memory devices comprising address pins and data pins, said apparatus comprising:

a sequence controller for sequencing the injections of said test signals and the comparisions of said resulting output signals with said standards, a format and timing generator for generating format and timing information corresponding to said test signals and said standards, a sequence generator for causing said format and timing generator to provide updated format and timing information corresponding to each of said test signals and said standards for testing said LSI devices, a group sequence generator for causing said format and timing generator to provide updated format and timing information corresponding to groups of said test signals and said standards for testing said memory devices, and a mode controller responsive to said sequence controller for selectably activating either said sequence generator or said group sequence generator for testing respectively said LSI devices or said memory devices, an injector for injecting said test signals, and a comparator for comparing said resulting output signals with said standards.

3. The apparatus of claim 1 further comprising:

a format and timing generator for generating format and timing information corresponding to said test signals and standards, a sequence generator for causing said format and timing generator to provide updated format and timing information corresponding to each of said test signals and said standards for testing said LSI devices, a group sequence generator for causing said format and timing generator to provide updated format and timing information corresponding to groups of said test signals and standards for testing said memory devices, and a mode controller responsive to said sequence controller for selectably activating either said sequence generator or said group sequence generator for testing respectively said LSI devices or said memory devices.

4. The apparatus of claim 2 or 3 wherein said format and timing generator comprises
a format memory for storing format information, and
a format address memory responsive to said sequence controller for storing addresses corresponding to the locations in said format memory.

5. The apparatus of claim 2 or 3 wherein said format and timing generator comprises
a timing memory for storing timing information,
a timing generator for providing timing pulses in accordance with said timing information, and
a timing address memory responsive to said sequence controller for storing addresses corresponding to the locations in said timing memory.

6. The apparatus of claim 1, 2 or 3 further comprising
a comparator for providing error signals when said output signals differ from said standards, and
error processing circuitry connected to selectably store said error signals as a map corresponding to the memory locations in said memory devices, or as sequences of said error signals and said test signals corresponding to said pins of said LSI devices.

7. The apparatus of claim 8 wherein said error processing circuitry comprises
a fail proceessor responsive to said comparator,
a fail sequence memory responsive to said sequence controller and to said fail processor for storing said sequences, and
a fail map memory responsive to said fail processor and to said sequence controller for storing said map.

8. A method of testing LSI devices and memory devices by injecting test signals and comparing resulting output signals with standards, said devices each having a multiplicity of pins, said pins of said memory devices comprising address pins and data pins, said method comprising:
storing said test signals and standards for said LSI devices in a storage element,
when said device is an LSI device, triggering a selector to route said test signals and said standards from said storage element to said pins,
when said device is a memory device, causing a generator to generate said test signals and said standards, and simultaneously triggering said selector to route said test signals and said standards to said data pins,
said selector being triggered for testing LSI devices and memory devices in any desired order, and
comparing said resulting output signals with said standards.

9. A method of testing LSI devices and memory devices by injecting test signals and comparing resulting output signals with standards, said devices each having a multiplicity of pins, said method comprising:
storing format and timing information corresponding to each of said test signals and said standards for said LSI devices in a storage element,
storing format and timing information corresponding to groups of said test signals and said standards for said memory devices in said storage element,
when said device is an LSI device, generating an address corresponding to each of said test signals and said standards, and simultaneously triggering a selector to route each said address to said storage element,
when said device is a memory device, generating an address corresponding to each of said groups of said test signals and said standards, and simultaneously triggering a selector to route each said address to said storage element,
said addresses being generated and said selector being triggered for testing LSI devices and memory devices in any desired order,
injecting said test signals, and
comparing said resulting output signals with said standards.

10. The method of claim 8 further comprising
storing format and timing information corresponding to each of said test signals and said standards for said LSI devices in a further storage element,
storing format and timing information corresponding to groups of said test signals and said standards for said memory devices in said further storage element,
when said device is an LSI device, generating an address corresponding to each of said test signals and said standards, and simultaneously triggering a selector to route each said address to said further storage element, and
when said device is a memory device, generating an address corresponding to each of said groups of said test signals and said standards, and simultaneously triggering a selector to route each said address to said further storage element,
said addresses being generated and said selector being triggered for testing LSI devices and memory devices in any desired order.

11. A method of testing LSI devices having memory portions and non-memory portions by injecting test signals and comparing resulting output signals with standards, said devices each having a multiplicity of pins, said method comprising
storing said test signals and standards for said non-memory portions in a first storage element,
storing format and timing information corresponding to each of said test signals and standards for said non-memory portions in a second storage element,
storing format and timing information corresponding to groups of said test signals and said standards for said memory portions in said second storage element,
triggering a selector to route said test signals and said standards from said first storage element to said pins of said non-memory portions,
generating an address corresponding to each of said test signals and said standards for said non-memory portions, and simultaneously triggering a selector to route each said address to said second storage element,
causing a generator to generate said test signals and said standards for said memory portions, and simultaneously triggering said selector to route said test signals and said standards to the data pins of said memory portions,
generating an address corresponding to each of said groups of said test signals and said standards for said memory portions, and simultaneously triggering a selector to route each said address to said second storage element, and
comparing said resulting output signals with said standards.

* * * * *